United States Patent
Gillberg (10) Patent No.: US 8,183,892 B2
(45) Date of Patent: May 22, 2012

(54) MONOLITHIC LOW IMPEDANCE DUAL GATE CURRENT SENSE MOSFET

(75) Inventor: James E. Gillberg, Flemington, NJ (US)

(73) Assignee: Fairchild Semiconductor Corporation, South Portland, ME (US)

( * ) Notice: Subject to any disclaimer, the term of this patent is extended or adjusted under 35 U.S.C. 154(b) by 164 days.

(21) Appl. No.: 12/479,613

(22) Filed: Jun. 5, 2009

(65) Prior Publication Data

US 2010/0308872 A1    Dec. 9, 2010

(51) Int. Cl.
    *H03K 3/00*    (2006.01)
(52) U.S. Cl. ...................................... 327/108
(58) Field of Classification Search .................. None
    See application file for complete search history.

(56) References Cited

U.S. PATENT DOCUMENTS

| | | |
|---|---|---|
| 3,660,697 A | 5/1972 | Berglund et al. |
| 4,445,202 A | 4/1984 | Goetze et al. |
| 4,454,454 A | 6/1984 | Valentine |
| 4,554,512 A | 11/1985 | Aiello |
| 4,593,213 A | 6/1986 | Vesce et al. |
| 4,616,305 A | 10/1986 | Damiano et al. |
| 4,618,872 A | 10/1986 | Baliga |
| 4,654,769 A | 3/1987 | Middlebrook |
| 4,689,731 A | 8/1987 | Walker et al. |
| 4,725,746 A | 2/1988 | Segawa et al. |
| 4,728,826 A | 3/1988 | Einzinger et al. |
| 4,748,351 A | 5/1988 | Barzegar |
| 4,758,941 A | 7/1988 | Felton et al. |
| 4,760,293 A | 7/1988 | Hebenstreit |
| 4,853,563 A | 8/1989 | Hill et al. |
| 4,866,495 A | 9/1989 | Kinzer |
| 4,882,663 A | 11/1989 | Nilssen |
| 4,888,504 A | 12/1989 | Kinzer |
| 5,023,678 A | 6/1991 | Kinzer |
| 5,124,595 A | 6/1992 | Mandelcorn |
| 5,204,563 A | 4/1993 | Jason |
| 5,227,781 A | 7/1993 | Ninnis |
| 5,264,736 A | 11/1993 | Jacobson |
| 5,323,044 A | 6/1994 | Rumennik et al. |

(Continued)

OTHER PUBLICATIONS

PROFET Data Sheet BTS555—Smart Highside High Current Power Switch Reversave, Jun. 24, 2008, pp. 1-16, Infineon Technologies.

(Continued)

*Primary Examiner* — Lincoln Donovan
*Assistant Examiner* — Khareem E Almo
(74) *Attorney, Agent, or Firm* — Kilpatrick Townsend & Stockton LLP (57) ABSTRACT

A power switch includes a first power transistor having a first source electrode, a first gate electrode, and a first drain electrode, and a second power transistor having a second source electrode, a second gate electrode, and a second drain electrode. The power switch further includes a first pilot transistor has a third source electrode, a third gate electrode, and a third drain electrode. The first, second and third drain electrodes are electrically connected together. The first and second source electrodes are electrically connected together. The first and third gate electrodes are electrically connected together and can be biased independently from the second gate electrode. The first power transistor is the same size as or smaller than the second power transistor and the first power transistor is larger than the first pilot transistor. The first power transistor, the second power transistor, and the first pilot transistor are monolithically integrated in an integrated circuit.

10 Claims, 4 Drawing Sheets

U.S. PATENT DOCUMENTS

| | | |
|---|---|---|
| 5,332,938 A | 7/1994 | McEwan |
| 5,399,908 A | 3/1995 | Donaldson |
| 5,416,387 A | 5/1995 | Cuk et al. |
| 5,510,747 A | 4/1996 | Williams |
| 5,550,412 A | 8/1996 | Anneser |
| 5,570,276 A | 10/1996 | Cuk et al. |
| 5,616,945 A | 4/1997 | Williams |
| 5,629,542 A | 5/1997 | Sakamoto et al. |
| 5,635,867 A | 6/1997 | Timm |
| 5,689,144 A | 11/1997 | Williams |
| 5,719,529 A * | 2/1998 | Kawahara et al. ............ 330/253 |
| 5,731,732 A | 3/1998 | Williams |
| 5,734,258 A | 3/1998 | Esser |
| 5,796,274 A | 8/1998 | Willis et al. |
| 5,867,014 A * | 2/1999 | Wrathall et al. ............. 323/316 |
| 5,909,108 A | 6/1999 | He et al. |
| 5,959,442 A | 9/1999 | Hallberg et al. |
| 5,973,367 A | 10/1999 | Williams |
| 6,115,267 A | 9/2000 | Herbert |
| 6,215,288 B1 | 4/2001 | Ramsey et al. |
| 6,249,111 B1 | 6/2001 | Nguyen |
| 6,310,468 B1 | 10/2001 | Feldtkeller |
| 6,353,309 B1 * | 3/2002 | Ootani et al. ................. 323/282 |
| 6,400,579 B2 | 6/2002 | Cuk |
| 6,906,536 B2 * | 6/2005 | Pearce et al. .................. 324/713 |
| 6,930,473 B2 | 8/2005 | Elbanhawy |
| 7,271,626 B1 * | 9/2007 | Burinskiy et al. ............ 327/108 |
| 7,319,314 B1 * | 1/2008 | Maheshwari et al. ........ 323/313 |
| 7,345,342 B2 | 3/2008 | Challa et al. |
| 7,710,168 B2 * | 5/2010 | Bapat ............................ 327/108 |
| 7,782,080 B2 * | 8/2010 | Eaton .............................. 326/30 |
| 7,808,284 B2 * | 10/2010 | Tanaka .......................... 327/108 |
| 2004/0196055 A1 * | 10/2004 | Pearce et al. .................. 324/713 |
| 2006/0097759 A1 * | 5/2006 | Omori et al. .................. 327/108 |
| 2009/0091986 A1 * | 4/2009 | Bringivijayaraghavan et al. ....................... 365/189.05 |

OTHER PUBLICATIONS

FGB3040CS 300mJ, 400V, N-Channel Sensing Ignition IGBT, Data Sheet, May 2007, pp. 1-9, Fairchild Semiconductor Corporation.

FDBS02H04/FDPS02H04 Smart High Side Switch, Data Sheet, Jan. 2009, pp. 1-9, Fairchild Semiconductor Corporation.

FDP8444CS PT4 40/20V N-Channel Standard Gate with Current Sense 40V, 70A, 5mΩ, Advanced Information Data Sheet, Aug. 2006, pp. 1-4, Fairchild Semiconductor Corporation.

FDMS2380 Dual Integrated Solenoid Driver, Data Sheet, Aug. 2007, pp. 1-15, Fairchild Semiconductor Corporation.

\* cited by examiner

MONOLITHIC LOW IMPEDANCE DUAL GATE CURRENT SENSE MOSFET

BACKGROUND OF THE INVENTION

The present invention relates in general to semiconductor power devices, and in particular to an apparatus and method for a dual gate low impedance power switch which enables accurate current sensing and has improved thermal dissipation characteristics.

Advances in power device technology have resulted in power transistors, such as MOSFETs and IGBTs, having very low drain to source resistance or $R_{DS(ON)}$. A low $R_{DS(ON)}$ is desirable, because it allows higher current drive and lower heat dissipation thus resulting in reduced power loss in the power transistor.

Current sense schemes are used to detect the current through the power transistor to prevent permanent damage. Sense amplifiers used to detect the current through power transistors typically have an offset error. For the sense amplifier to accurately sense the current through the power transistor, the signal that is being sensed needs to be sufficiently greater than the offset error of the amplifier so that the sense amplifier can accurately measure the current through the power transistor. However, with substantially reduced $R_{DS(ON)}$, the voltage drop across the power transistor has reduced to such degree that the amplifier offset voltage has become a significant percentage of the voltage drop across the power transistor, thus compromising the ability of the amplifier to accurately sense the current through the power transistor. Attempts have been made to design amplifiers with low offset voltages, but these amplifiers are complex and costly.

Thus, there is a need for a technique that enables accurate measurement of the current through low impedance power transistors without the need for complicated sensing circuitry.

BRIEF SUMMARY OF THE INVENTION

In accordance with an embodiment of the invention, a power switch includes a first power transistor having a first source electrode, a first gate electrode, and a first drain electrode, and a second power transistor having a second source electrode, a second gate electrode, and a second drain electrode. The power switch further includes a first pilot transistor has a third source electrode, a third gate electrode, and a third drain electrode. The first, second and third drain electrodes are electrically connected together. The first and second source electrodes are electrically connected together. The first and third gate electrodes are electrically connected together and can be biased independently from the second gate electrode. The first power transistor is the same size as or smaller than the second power transistor and the first power transistor is larger than the first pilot transistor. The first power transistor, the second power transistor, and the first pilot transistor are monolithically integrated in an integrated circuit.

In one embodiment, during operation when the first power transistor and the first pilot transistor are simultaneously turned on, a ratio of a current flowing through the first power transistor to a current flowing through the first pilot transistor is proportional to a ratio of the size of the first power transistor to the size of the pilot transistor.

In another embodiment, the power switch further include a second pilot transistor having a fourth source electrode, a fourth gate electrode, and a fourth drain electrode. The first drain, the second drain, the third drain, and fourth drain are electrically connected together, and the second gate and the fourth gate are electrically connected together. The second power transistor is larger than the second pilot transistor. The first and second power transistors and the first and second pilot transistors are all monolithically integrated in an integrated circuit.

In another embodiment, during operation, when the second power transistor and the second pilot transistor are simultaneously turned on, a ratio of a current flowing through the second power transistor to a current flowing through the second pilot transistor is proportional to a ratio of the size of the second power transistor to the size of the second pilot transistor.

In accordance with another embodiment of the invention, a power switch includes a first power transistor including a first plurality of polysilicon strips forming a gate terminal of the first power transistor, and a second power transistor including a second plurality of polysilicon strips forming a gate terminal of the second power transistor. The first and second power transistors have their drain regions connected together, and their source regions connected together, but their gate terminals are isolated from each other so that the first and second power transistors can be independently turned on and off. The first plurality of polysilicon strips and the second plurality of polysilicon strips are interleaved to reduce the thermal resistance of the power switch when only one of the first and second power transistors is turned on.

In one embodiment, a spacing between adjacent polysilicon strips is less than a thickness of a die containing the first and second transistors.

In another embodiment, the power switch further includes a first pilot transistor which includes one or more polysilicon strips having a length substantially equal to a length of the first plurality of polysilicon strips. The one or more polysilicon strips of the first pilot transistor are connected to the first plurality of polysilicon strips. The first pilot transistor has a common drain region with the first and second transistors, and the source regions of the first pilot transistor are connected to a first pilot source pad.

In another embodiment, the power switch further includes a second pilot transistor which includes one or more polysilicon strips having a length substantially equal to a length of the second plurality of polysilicon strips. The one or more polysilicon strips of the second pilot transistor are connected to the second plurality of polysilicon strips. The second pilot transistor has a common drain region with the first and second transistors, and the source regions of the second pilot transistor are connected to a second pilot source pad.

In accordance with another embodiment of the invention, a protected power switch includes a dual-gate power switch which in turn includes parallel-connected first and second power transistors and a first pilot transistor. The drain terminals of the first power transistor, the second power transistor and the first pilot transistor are connected together. A gate terminal of the first power transistor and a gate terminal of the first pilot transistor are connected together, and source terminals of the first and second power transistors are connected together. The first power transistor, the second power transistor, and the first pilot transistor are monolithically integrated in an integrated circuit. The protected power switch further includes a driver circuit coupled to drive the two gates of the dual-gate power switch, and a sense amplifier coupled to the first pilot transistor and configured to detect the amount of current flowing through the first power transistor when in the on state, and in response to the detected amount of current, cause the driver circuit to maintain the first power transistor in the on state, or turn off the first power transistor, or turn on or off the second power transistor.

In one embodiment, during operation when the first power transistor and the first pilot transistor are simultaneously turned on, a ratio of a current flowing through the first power transistor to a current flowing through the first pilot transistor is proportional to a ratio of the size of the first power transistor to the size of the pilot transistor.

In another embodiment, upon turning on the power switch, the driver circuit turns on the first power transistor and the pilot transistor and maintains the second power transistor in the off state, and the sense amplifier detects the amount of current flowing through the first power transistor via the pilot transistor, and if the amount of current is below a predetermined amount, the driver circuit turns on the second power transistor.

In another embodiment, the protected power switch further includes a second pilot transistor. A drain terminal of the second pilot transistor is connected to the drain terminals of the first power transistor, the second power transistor and the first pilot transistor, and a gate terminal of the second pilot transistor is connected to the gate terminal of the second power transistor. The first and second power transistors together with the first and second pilot transistors are monolithically integrated in an integrated circuit.

In another embodiment, during operation when the second power transistor and the second pilot transistor are simultaneously turned on, a ratio of a current flowing through the second power transistor to a current flowing through the second pilot transistor is proportional to a ratio of the size of the second power transistor to the size of the second pilot transistor.

In another embodiment, the protected power switch further includes a pilot load connected between a source electrode of the first pilot transistor and ground potential, and the sense amplifier has two input electrodes connected across the pilot load to detect a voltage drop across the pilot load during operation.

DETAILED DESCRIPTION OF THE INVENTION

In accordance with embodiments of the present invention, a monolithically integrated dual-gate low impedance power switch with one or more current sense elements enables accurate sensing of the current flow through the power switch. In one embodiment, the monolithically integrated dual-gate low impedance power switch includes two parallel-connected power transistors with gates that can be independently biased. The two power transistors may be sized so that one is greater than the other and thus one has a lower impedance than the other. A current sense element is coupled to the smaller transistor and is configured to facilitate sensing of the current through the smaller transistor. During operation, when the power switch is to be turned, the smaller transistor is initially turned on while the larger transistor is maintained in the off state. This, in effect, makes the power switch appear to the sensing circuitry as having a higher impedance, which advantageously minimizes the error in sensing the current through the switch. Once the output of the switch has reached a target value, the larger transistor may be turned on so that the full current capability of the power switch is made available for driving the load, and to reduce the power loss of the switch. In one layout embodiment, the gates of the smaller and larger transistors are interleaved so that the thermal resistance of the switch during the time that only the smaller transistor is turned on is substantially similar to when both the smaller and larger transistors are turned on. These and other features and advantages of the invention will be described more fully with reference to the various embodiments that are described next.

Figure 1A:
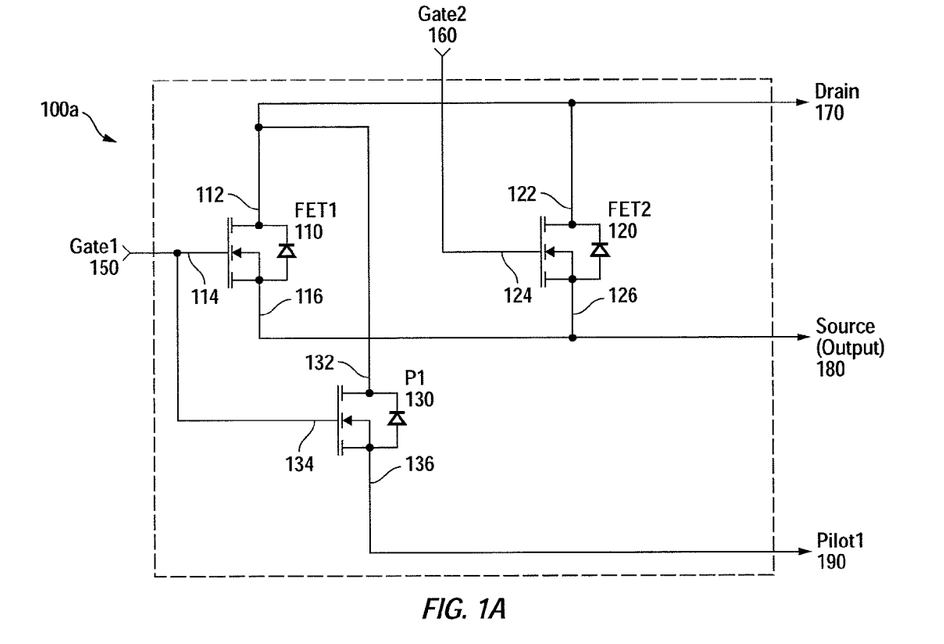
FIGS. 1A-1B are simplified schematics of dual-gate power switches according to embodiments of the invention.

FIG. 1A is a simplified schematic diagram of a monolithically integrated low impedance dual-gate power MOSFET switch 100a according to one embodiment of the present invention. Power switch 100a comprises two field effect transistors FET1 110 and FET2 120. FET1 110 is less than or equal to FET2 120 in size. FET1 110 and FET2 120 are electrically connected in parallel. That is, drain 112 of FET1 and drain 122 of FET2 are electrically connected together and to a drain terminal 170, and source 116 of FET1 and source 126 of FET2 are electrically connected together and to a source terminal 180. Gate 114 of FET1 and gate 124 of FET2 are respectively connected to separate gate terminals GATE1 150 and GATE2 160 so that FET1 and FET2 can be independently switched on and off.

A pilot transistor P1 130 is electrically connected to FET1 110. Pilot transistor P1 130 is a fraction of the size of FET1. Pilot transistor P1 130 serves as the current sense element. Drain 132 and gate 134 of pilot transistor P1 130 are connected to drain 112 and gate 114 of FET1 110, respectively. Source 136 of pilot transistor P1 130 is electrically connected to pilot terminal PILOT1 190. As is shown and described further below, transistors FET1 110, FET2 120, and P1 130 are monolithically integrated in a single die.

At power on of power switch 100a, a positive voltage is applied at GATE1 150, which turns on FET1 110 and P1 130 while FET2 remains off. Turning on only part of power switch 100a results in a higher resistance between drain terminal 170 and source terminal 180 than when the both FET 1 and FET2 are turned on. The higher resistance in turn results in a higher voltage drop across switch 100a which enables a more accurate sensing of the current flowing through switch 100a. An example is used to illustrate the improvement in sensing accuracy.

To monitor the current through the pilot transistor, a load is connected between the source of the pilot transistor and ground potential. The current that flows through the pilot transistor also flows through the pilot load and thus develops a voltage across the pilot load that is then detected by a sense amplifier. The impedance of the pilot load can be increased in order to increase the voltage that the amplifier detects, however any voltage dropped across the pilot load is, in effect, subtracted from the drain-to-source voltage Vds of the pilot transistor as compared to the power switch. As the voltage across the pilot load increases, reducing the Vds of the pilot transistor, the current in the pilot transistor decreases, which makes the sense ratio less accurate. The voltage drop across the pilot load needs to be small compared to the Vds of the power switch, otherwise the higher voltage at the source of the pilot transistor will begin to turn the power switch off. If the power switch has an impedance of $2m\Omega$, the offset voltage of the amplifier is 10 mV, and the voltage drop across the pilot load needs to be no more then ⅕ the Vds of the power switch for accuracy, then the sense amplifier can not detect a current less than 25 A with any accuracy. However, by turning on only a portion of the power switch (e.g., FET1) that has an impedance of, for example, 5 m$\Omega$, the sense amplifier can detect a current of 10 A accurately, and the need for use of complex sensing schemes is eliminated. After the sensing cycle, when the desired state is reached (e.g., the output has reached the target value, or it is determined that switch 100a is not in over-current condition), the second transistor FET2 can be turned on to provide the full current capability of the switch, and to minimize the power loss in switch 100a.

In addition to the improved sensing accuracy, the technique of initially turning on only a portion of the power switch has the benefit of reduced input capacitance than when the whole switch 100a is turned on. Also, the miller capacitance only has an effect while switching a transistor. A lower miller capacitance is thus obtained since by the time FET2 is turned on, the output has already switched. The lower Miller capacitance means that a smaller driver can be used to drive GATE1 150, or alternatively the driver originally sized for the whole power switch 100a can turn on power switch 100a faster. Further, with a smaller input capacitance, the drive requirements of the charge pump driving the gate of the power switch is substantially relaxed. Thus, substantial improvements both in terms of minimized complexity and reduced die size are obtained.

While the above operation of switch 100a contemplates turning on FET2 some period of time after turning on FET1, the two FETs need not be operated in that manner. For example, if the load current is low and FET1 on its own can supply the load current, then FET2 does not need to be turned on at all. However, if the load current is larger than what FET1 can supply, then FET2 can be turned on to provide the necessary current capacity and to minimize power loss in the switch.

Figure 1B:
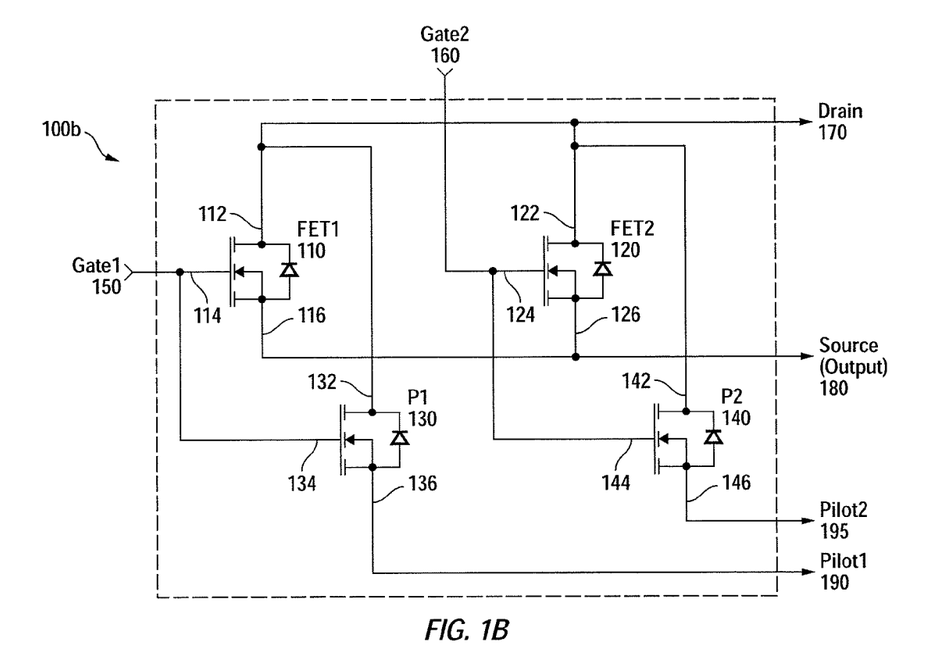

Referring to FIG. 1B, an optional second pilot transistor P2 140 can be monolithically integrated in power switch 100b. Pilot transistor P2 140 together with Pilot transistor P1 130 serve as the current sense element in this embodiment. Pilot transistor P2 140 is electrically connected to FET2 120. Drain 142 and gate 144 of pilot transistor P2 140 is connected to drain 122 and gate 124 of FET2 120, respectively. Source 146 of P2 140 is electrically connected a second pilot terminal Pilot2 195. In one operation mode, when both FET1 and FET2 are on and the current sensed via pilot transistors P1 and P2 exceeds a limit, then power switch 100b can be turned off to prevent damage to power switch 100b.

Figure 2:
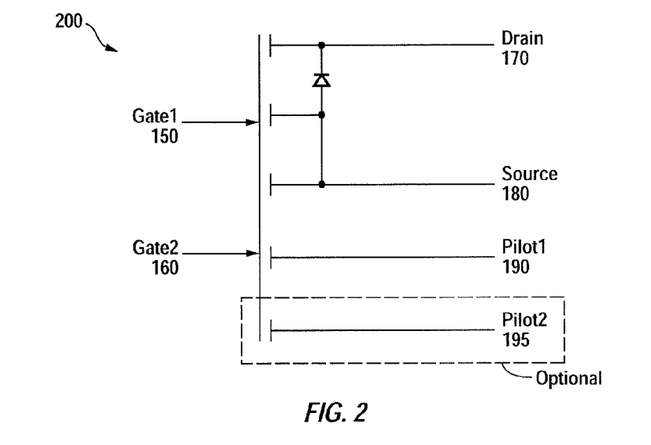
FIG. 2 is a schematic symbol representing a dual-gate power switch according to an embodiment of the invention.

FIG. 2 is a power switch symbol 200 for the power switch shown in FIGS. 1A and 1B. Power switch 200 has dual gates GATE1 150 and GATE2 160, a drain terminal 170, a source terminal 180, a pilot terminal Pilot1 190 (FIG. 1A), and optionally a second pilot terminal Pilot2 195 (FIG. 1B). Power transistor 200 may have additional terminals for temperature sensing, not shown.

Figure 3A:
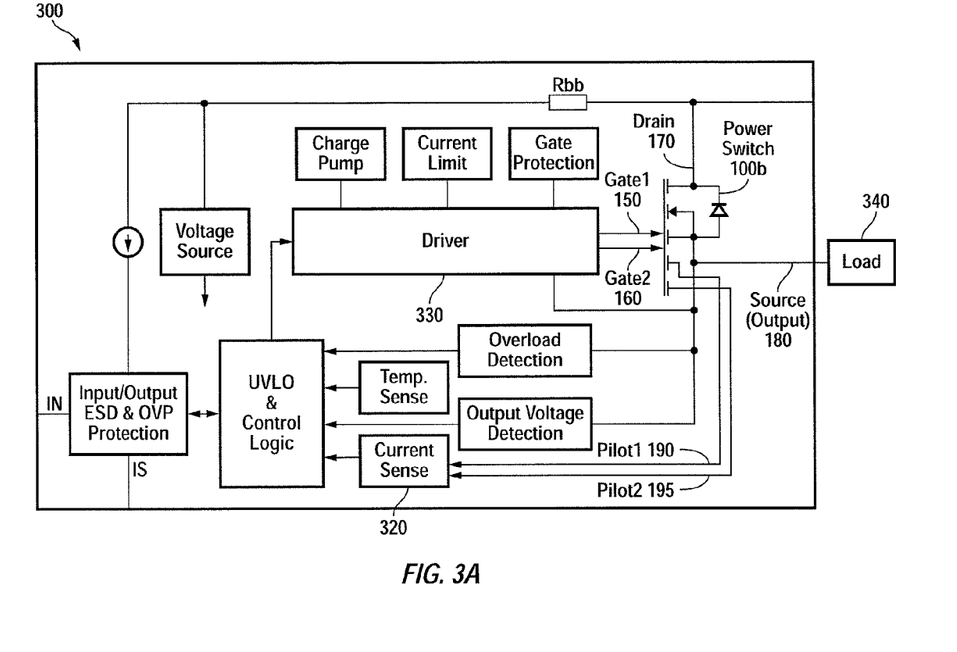
FIG. 3A is a simplified block diagram of an application incorporating a monolithically integrated dual-gate power switch according to an embodiment of the invention.
Figure 3B:
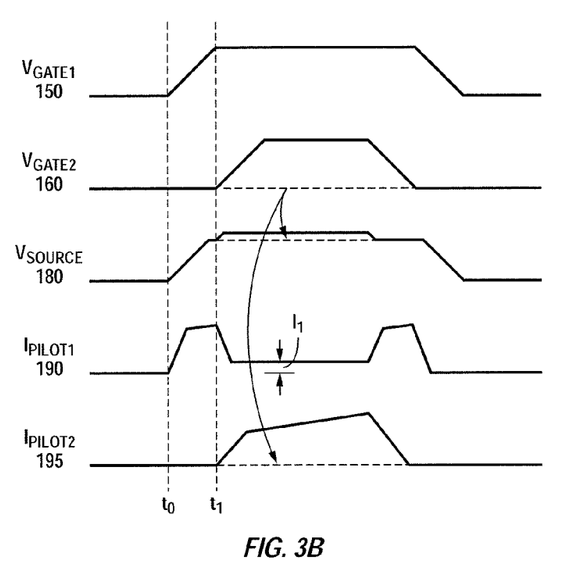
FIG. 3B is a timing diagram showing timing waveforms at various terminals of the power switch shown in the FIG. 3A block diagram.

FIG. 3A is a simplified block diagram of a protected power switch in which power switch 100b shown in FIG. 1B is incorporated. FIG. 3B is a simplified timing diagram showing timing waveforms at various terminals of power switch 100b during operation. In FIG. 3A, pilot terminals Pilot1 190 and Pilot2 195 are coupled to ground through a load (not shown). Current sense block 320 is configured to measure the current through the load which corresponds to the current through Pilot1 190 and Pilot2 195. The various blocks in FIG. 3A (e.g., the charge pump, current limit block, gate protection block, UVLO & control logic block, etc.) and their function are well known in the art and thus will not be described herein. FIGS. 3A and 3B however, will be used to describe the operation of power switch 100b.

In FIG. 3B, the on-cycle (i.e., the cycle during which power switch 100b is on) is used to describe the operation of power switch 100b. Prior to time $t_0$, power switch 100b is off, source terminal 180 is at low reference potential, and pilot terminals Pilot1 190 and Pilot2 195 are pulled low by a load tied between the pilot terminals and the ground potential. At time $t_0$, driver block 330 raises the voltage at GATE1 150 while maintaining GATE2 160 low. Based upon the voltage at Pilot1 190, current sense block 320 determines the amount of current flowing through FET1 110. If the current measured by current sense block 320 is below a predetermined value indicating that switch 100b is not in over-current condition, then driver block 330 maintains FET1 on. At time $t_1$, when the potential at source 180 of switch 100b reaches a predetermined value, the second transistor FET2 120 may be turned on depending on the load current. If the load current is large, the second transistor FET2 120 can be turned on to supply the necessary current and to minimize power consumption. If the load current is small, the second transistor FET2 120 may be maintained in the off state (the horizontal dashed lines in FIG. 3B reflect this condition).

The delay between t0 and t1 can be set so that by the time FET2 is turned on, the output switching for the most part has been completed. This ensures that little or no dynamic loss occurs in FET2 when it is turned on at time $t_1$. As shown by current waveforms $I_{PILOT1}$ (which reflects the transient current through FET1) and $I_{PILOT2}$ (which reflects the transient current through FET2), between times t0 and t1 when only FET1 is on, FET1 supplies the load current to load 340. After time $t_1$, when both FET1 and FET2 are on, because FET2 can be a larger transistor with a lower $R_{DS(ON)}$ than FET1, a substantial amount of the load current can be supplied by FET2. In this case, a smaller fraction of the load current (shown in FIG. 3B as $I_1$) is supplied by FET1.

During operation of power switch 100b, current sense block 320 detects the amount of current flowing through FET1 and FET2 based upon the voltage generated by the combined current through pilot terminals Pilot1 190 and Pilot2 195. If the amount of current is above a value indicating excessive current draw, then switch 100b is turned off to prevent over-current damage to switch 100b.

Figure 4:
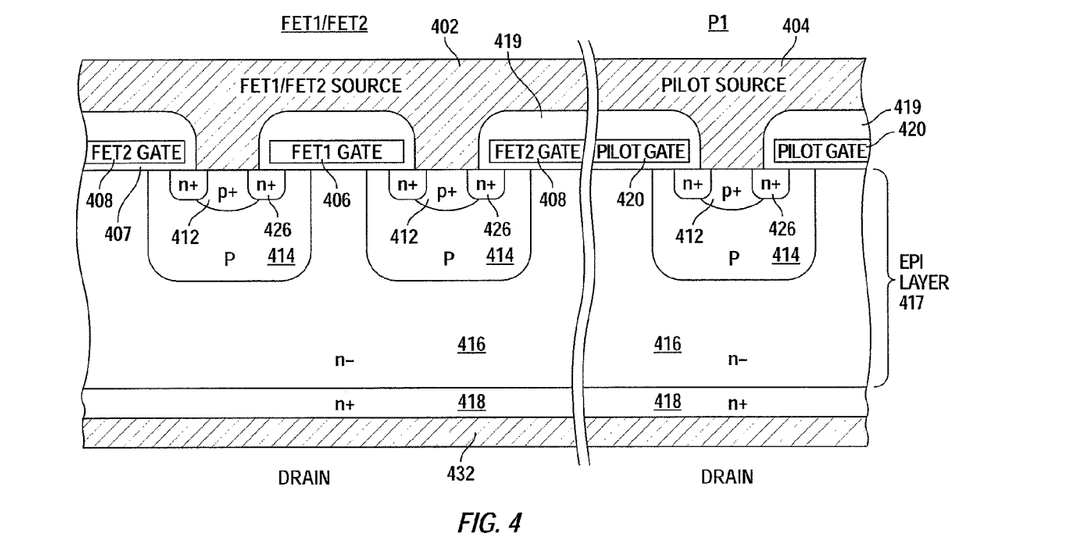
FIG. 4 is a simplified cross-sectional view of a monolithically integrated dual-gate power switch according to an embodiment of the invention.

As indicated earlier, FET1, FET2 and P1 (FIG. 1A) form a monolithically integrated MOSFET. FIG. 4 is a simplified cross-sectional view of such power MOSFET. Transistors FET1, FET2, and P1 include a common drain region which includes back-side drain interconnect 432 (e.g., comprising metal). The MOSFET includes n+ substrate 418 with an overlying n-type epitaxial layer 417. The portions of epitaxial layer 417 extending between body regions 414, and between body regions and substrate 418 form what is commonly referred to as drift region 416. P-type body regions 414 extend in epitaxial layer 417. N+ source regions 426 and p+ heavy body regions 412 extend in body regions 414. Polysilicon gate electrodes 406, 408 and 420 of FET1, FET2 and P1, respectively, laterally extend over and are insulated from epitaxial layer 417 by gate dielectric layer 407. In the exemplary embodiment shown in FIG. 4, gate electrode 406 for FET1 and gate electrode 408 for FET2 are alternately arranged and are connected to separate gate metal interconnects, not shown. As described in detail in reference to FIG. 5 further below, the gate electrodes for FET1 and FET2 may be arranged in other configurations (e.g., one gate electrode for FET1 may be formed for every four adjacent gate electrodes for FET2). Source regions 426 and body regions 414 of FET1 and FET2 are connected to source metal interconnect 402 which serves as the common source terminal for FET1 and FET2. Source regions 426 and body regions 412 of pilot transistor P1 are connected to pilot source metal interconnect 404 which is insulated from FET1/FET2 source metal interconnect 402. Pilot source metal interconnect 404 and FET1/FET2 source metal interconnect 402 are insulated from corresponding polysilicon gate electrodes 406, 408, 420 by a dielectric layer 419. Polysilicon gate electrode 420 of pilot transistor P1 is connected to the same gate metal interconnect (not shown) that gate electrode 406 of FET1 is connected.

While the FIG. 4 embodiment shows a planar gate vertical MOSFET, implementing the dual-gate switch with one or more pilot transistors in other types of MOSFET structures, such as trench gate MOSFETs (where gate electrodes are embedded in trenches that extend into epitaxial layer 417), lateral MOSFETs (where the drain terminal is formed along the top side of the die), and IGBT and P channel variations of these MOSFETs would be obvious to one skilled in the art in view of this disclosure.

Figure 5:
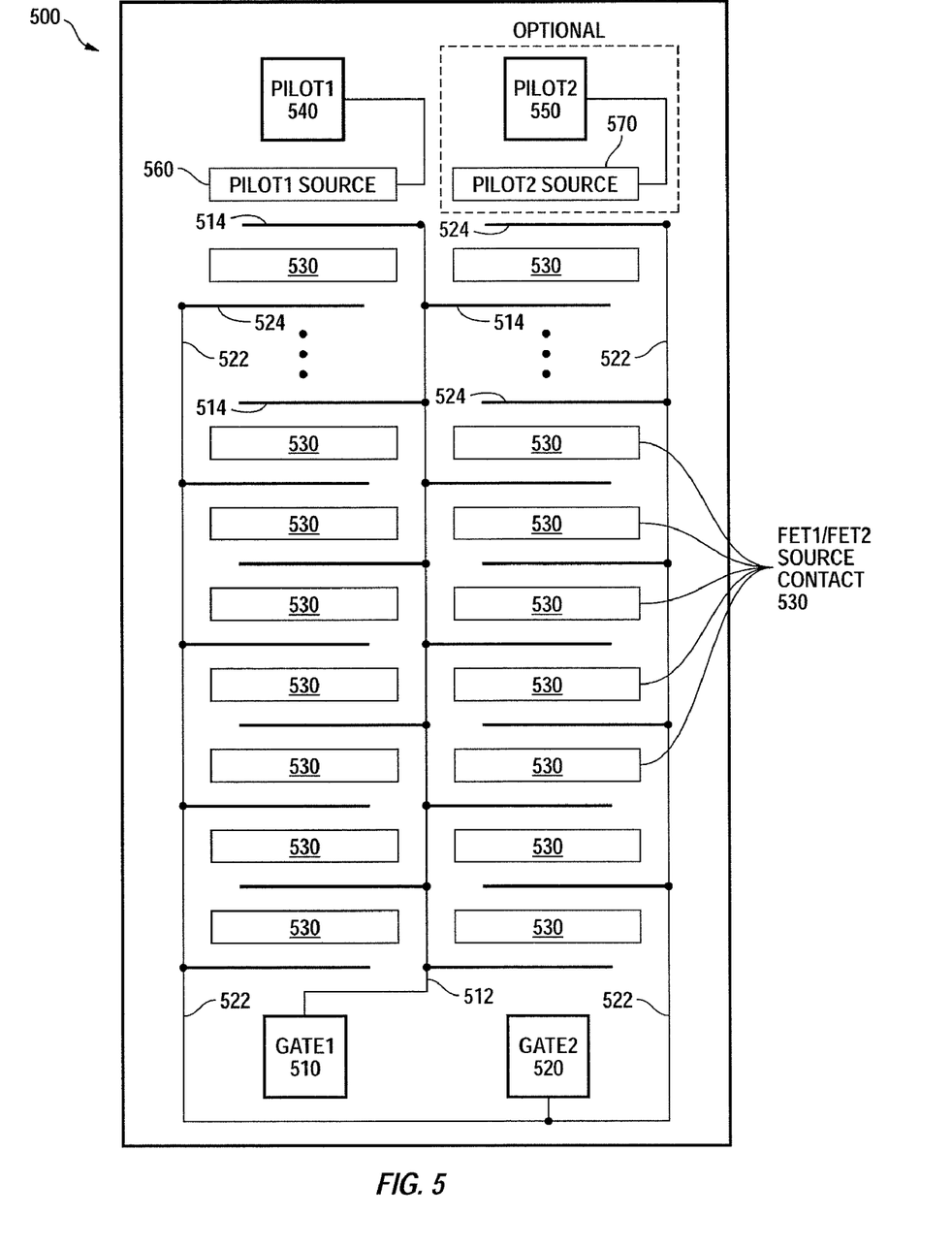
FIG. 5 is a simplified layout diagram of a monolithically integrated dual-gate power switch according to an embodiment of the present invention.

FIG. 5 is a simplified top view of power MOSFET 500 showing an exemplary layout diagram corresponding to the embodiment of FIG. 1B. Power transistor 500 has dual gates which include laterally extending polysilicon gate strips 514 and 524 that are respectively connected to gate pads GATE1 510 and GATE2 520 through metal gate runners 512 and 522. Gate pad GATE1 510 corresponds to gate terminal GATE1 150 of FET1 in FIG. 1B, and gate pad GATE2 520 corresponds to gate terminal GATE2 160 of FET2 in FIG. 1B. Source contacts 530 are formed between polysilicon gate strips 514, 524, and electrically connect the underlying source and heavy body regions (e.g., corresponding to source regions 426 and heavy body regions 412 in FIG. 4) to the source metal interconnect extending over the active region (e.g., corresponding to FET1/FET2 source metal interconnect 402 in FIG. 4). In this manner, the source metal interconnect forms a common source terminal for FET1 and FET2. A common drain metal interconnect (e.g., corresponding to drain metal 432 in FIG. 4) extends along the backside of transistor 500 and forms a common drain terminal for FET1 and FET2 (for the vertical transistor example).

In FIG. 5, metal gate runner 512 for FET1 extends through the center area, and metal gate runners 522 for FET2 extend along the outer periphery. This configuration could be reversed. Also, polysilicon gate strips 514 for FET1 are shown to be interleaved with polysilicon gate strips 524 for FET2 in an alternating manner. This results in FET1 and FET2 being of equal size, however the invention is not limited as such. Depending on the target sizes of FET1 and FET2, as well as other design considerations, polysilicon gate strips 514 and 524 may be interleaved differently than every other one. For example, if FET1 is desired to be one-quarter the size of FET2, the interleaving can be reconfigured so that one polysilicon gate strip 514 is inserted for every four adjacent polysilicon gate strips 524.

In FIG. 5, the upper most polysilicon gate strip 514 forms the gate of pilot transistor P1. The gate of pilot transistor P1 is thus electrically connected to GATE 1 510 of FET 1. The drain of pilot transistor P1 is commonly connected on the backside to the drain metal (not shown). However, source contacts 560 of the upper most polysilicon gate strip 514 is routed to a pad marked as Pilot1 540 which can be externally accessed. Pilot pad Pilot1 540 corresponds to pilot terminal Pilot1 190 in FIG. 1B. Depending on the desired size ratio between FET1 and pilot transistor P1, more polysilicon gate strips 514 may be dedicated to pilot transistor P1, with their respective source contacts routed to pilot pad Pilot1 540. The particular layout configuration shown in FIG. 5 advantageously allows adjusting the size of pilot transistor P1 by merely changing the metal mask. As shown in FIG. 5, pilot transistor P2 may optionally be formed by using one or more of the upper most polysilicon gate strips 524 in a similar manner to pilot transistor P1. By monolithically integrating the pilot device(s) in the power switch in the manner shown in FIG. 5, excellent pilot matching is advantageously obtained.

In the layout of power transistor 500 shown in FIG. 5, gate stripes 514 of FET1 and gate strips 524 of FET2 are advantageously interleaved so that upon power up when only FET1 is turned on, the heat generated by FET1 is spread throughout power transistor 500 interspersed by regions of the transistor which are not active. In one embodiment, the spacing of gate strips 514, 524 is no more than the thickness of the die containing power transistor 500. Heat diffuses at approximately 45° angle through the silicon. Thus, a greater area of the device is available to dissipate heat and the thermal impedance of the power switch when only a portion of it is on is similar to when the whole transistor is on.

Although a number of specific embodiments are shown and described above, embodiments of the invention are not limited thereto. Therefore, the scope of the present invention should be determined not with reference to the above description but should be determined with reference to the appended claims, along with their full scope of equivalents.

What is claimed is:

1. A power switch comprising:
   a first power transistor including a first plurality of polysilicon strips forming a gate terminal of the first power transistor; and
   a second power transistor including a second plurality of polysilicon strips forming a gate terminal of the second power transistor, the first and second power transistors having their drain regions connected together, and their source regions connected together, but having their gate terminals isolated from each other so that the first and second power transistors can be independently turned on and off;
   wherein the first plurality of polysilicon strips and the second plurality of polysilicon strips are interleaved to reduce the thermal resistance of the power switch when only one of the first and second power transistors is turned on.

2. The power device of claim 1 wherein a spacing between adjacent polysilicon strips is less than a thickness of a die containing the first and second transistors.

3. The power switch of claim 2, further comprising a first pilot transistor which includes at least one polysilicon strip having a length substantially equal to a length of the first plurality of polysilicon strips, the at least one polysilicon strip of the first pilot transistor being connected to the first plurality of polysilicon strips, the first pilot transistor having a common drain region with the first and second transistors, and source regions of the first pilot transistor being connected to a first pilot source pad.

4. The power device of claim 3, further comprising a second pilot transistor which includes at least one polysilicon strip having a length substantially equal to a length of the second plurality of polysilicon strips, the at least one polysilicon strip of the second pilot transistor being connected to the second plurality of polysilicon strips, the second pilot transistor having a common drain region with the first and second transistors, and source regions of the second pilot transistor being connected to a second pilot source pad.

5. A protected power switch comprising:
a dual-gate power switch including parallel-connected first and second power transistors, and a first pilot transistor, wherein drain terminals of the first power transistor, the second power transistor and the first pilot transistor are connected together, a gate terminal of the first power transistor and a gate terminal of the first pilot transistor are connected together, and source terminals of the first and second power transistors are connected together, and the first power transistor, the second power transistor, and the first pilot transistor are monolithically integrated in an integrated circuit;
a driver circuit coupled to drive the two gates of the dual-gate power switch; and
a sense amplifier coupled to the first pilot transistor and configured to detect the amount of current flowing through the first power transistor when in the on state, and in response to the detected amount of current cause the driver circuit to maintain the first power transistor in the on state, or turn off the first power transistor, or turn on or off the second power transistor.

6. The protected power switch of claim 5 wherein during operation when the first power transistor and the first pilot transistor are simultaneously turned on, a ratio of a current flowing through the first power transistor to a current flowing through the first pilot transistor is proportional to a ratio of the size of the first power transistor to the size of the pilot transistor.

7. The protected power switch of claim 6 wherein upon turning on the power switch, the driver circuit turns on the first power transistor and the pilot transistor and maintains the second power transistor in the off state, and the sense amplifier detects the amount of current flowing through the first power transistor via the pilot transistor, and if the amount of current is below a predetermined amount, the driver circuit turns on the second power transistor.

8. The protected power switch of claim 5 further comprising a second pilot transistor, wherein a drain terminal of the second pilot transistor is connected to the drain terminals of the first power transistor, the second power transistor and the first pilot transistor, and a gate terminal of the second pilot transistor is connected to the gate terminal of the second power transistor, and the first and second power transistors together with the first and second pilot transistors are monolithically integrated in an integrated circuit.

9. The protected power switch of claim 8 wherein during operation when the second power transistor and the second pilot transistor are simultaneously turned on, a ratio of a current flowing through the second power transistor to a current flowing through the second pilot transistor is proportional to a ratio of the size of the second power transistor to the size of the second pilot transistor.

10. The protected power switch of claim 7 further comprising a pilot load connected between a source electrode of the first pilot transistor and ground potential, and the sense amplifier having two input electrodes connected across the pilot load to detect a voltage drop across the pilot load during operation.

* * * * *